United States Patent
Matsuo et al.

(10) Patent No.: US 10,483,014 B2
(45) Date of Patent: *Nov. 19, 2019

(54) ROLLED COPPER FOIL, METHOD OF MANUFACTURING A ROLLED COPPER FOIL, FLEXIBLE FLAT CABLE, AND METHOD OF MANUFACTURING A FLEXIBLE FLAT CABLE

(71) Applicants: FURUKAWA ELECTRIC CO., LTD., Tokyo (JP); FURUKAWA AUTOMOTIVE SYSTEMS INC., Inukami-gun, Shiga (JP)

(72) Inventors: Ryosuke Matsuo, Tokyo (JP); Kengo Mitose, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 313 days.

This patent is subject to a terminal disclaimer.

(21) Appl. No.: 15/279,821

(22) Filed: Sep. 29, 2016

(65) Prior Publication Data

US 2017/0018329 A1 Jan. 19, 2017

Related U.S. Application Data

(63) Continuation of application No. PCT/JP2015/060175, filed on Mar. 31, 2015.

(30) Foreign Application Priority Data

Mar. 31, 2014 (JP) .................................. 2014-073379

(51) Int. Cl.
*H01B 7/08* (2006.01)
*C22C 9/00* (2006.01)
(Continued)

(52) U.S. Cl.
CPC ................ *H01B 7/08* (2013.01); *B21C 1/02* (2013.01); *C22C 9/00* (2013.01); *C22F 1/08* (2013.01);
(Continued)

(58) Field of Classification Search
CPC .... B21C 1/02; C22C 9/00; C22F 1/08; H01B 13/0016; H01B 1/026; H01B 7/04; H01B 7/08

See application file for complete search history.

(56) References Cited

U.S. PATENT DOCUMENTS

2005/0092404 A1 5/2005 Aruga et al.
2011/0240180 A1 10/2011 Gao et al.
(Continued)

FOREIGN PATENT DOCUMENTS

CN 102812522 A 12/2012
EP 2 612 934 A1 7/2013
(Continued)

OTHER PUBLICATIONS

NPL: English on-line translation of WO2013031911A1 (Year: 2013).*
(Continued)

*Primary Examiner* — Jie Yang
(74) *Attorney, Agent, or Firm* — Birch, Stewart, Kolasch & Birch, LLP

(57) ABSTRACT

A rolled copper foil comprises one of copper and a copper alloy. The rolled copper foil has a rolled surface and two side surfaces adjacent to the rolled surface. Each of the side surfaces being a non-sheared surface that is not a sheared surface. An area ratio of crystal grains oriented at a deviation angle of less than or equal to 13° from Cube orientation is greater than or equal to 6%.

2 Claims, 4 Drawing Sheets

(51) Int. Cl.
| | |
|---|---|
| *C22F 1/08* | (2006.01) |
| *H01B 1/02* | (2006.01) |
| *B21C 1/02* | (2006.01) |
| *H01B 3/42* | (2006.01) |
| *H01B 7/04* | (2006.01) |
| *H01B 13/00* | (2006.01) |
| *H01B 13/06* | (2006.01) |

(52) U.S. Cl.
CPC ............ *H01B 1/026* (2013.01); *H01B 3/421* (2013.01); *H01B 7/04* (2013.01); *H01B 13/0003* (2013.01); *H01B 13/0016* (2013.01); *H01B 13/06* (2013.01)

(56) References Cited

U.S. PATENT DOCUMENTS

| | | |
|---|---|---|
| 2013/0008692 A1 | 1/2013 | Kimura et al. |
| 2014/0335372 A1 | 11/2014 | Yoshida et al. |
| 2018/0019559 A1* | 1/2018 | Matsuo ..................... B21B 1/40 |

FOREIGN PATENT DOCUMENTS

| | | |
|---|---|---|
| EP | 2610359 A1 | 7/2013 |
| EP | 2752498 A1 | 7/2014 |
| JP | 7-041873 U | 7/1995 |
| JP | 9-259649 A | 10/1997 |
| JP | 2006-326684 A | 12/2006 |
| JP | 2011-115305 A | 6/2011 |
| JP | 2011-117034 A | 6/2011 |
| JP | 2012-104376 A | 5/2012 |
| JP | 5307305 B1 | 10/2013 |
| JP | 5342712 B1 | 11/2013 |
| JP | 2014-218730 A | 11/2014 |
| KR | 10-2012-0112875 A | 10/2012 |
| WO | WO 2011/019042 A1 | 2/2011 |
| WO | WO 2011/115305 A1 | 9/2011 |
| WO | WO 2012/029717 A1 | 3/2012 |
| WO | WO 2013/031911 A1 | 3/2013 |

OTHER PUBLICATIONS

Chinese Office Action and Search Report issued in Chinese Application No. 201580010014.4 dated Jul. 3, 2017, together with an English translation.
Chinese Office Action, dated Aug. 30, 2018, for corresponding Chinese Application No. 201580010014.4, with an English translation.
International Preliminary Report on Patentability and English translation of the Written Opinion of the International Searching Authority (PCT/IB/373 and PCT/ISA/237), dated Oct. 4, 2016, for corresponding International Application No. PCT/JP2015/060175.
Partial Supplementary European Search Report, dated Nov. 28, 2017, for corresponding European Application No. 15774113.3.
Extended European Search Report, dated Apr. 10, 2018, for European Application No. 15774113.3.
International Search Report (PCT/ISA/210) issued in PCT/JP2015/060175, dated Jul. 7, 2015.
Written Opinion (PCT/ISA/237) issued in PCT/JP2015/060175, dated Jul. 7, 2015.
Korean Office Action dated Jan. 23, 2018 for corresponding Korean Application No. 10-2016-7024924, with English translation.
Korean Notice of Allowance, dated Jun. 19, 2018, for Korean Application No. 10-2016-7024924, along with an English translation.
Chinese Office Action, dated Feb. 27, 2018 for Chinese Application No. 201580010014.4, with an English translation.
European Office Action dated Nov. 26, 2018 for Application No. 15 774 113.3.
Chinese Notification for Granting an Invention Patent, dated Jan. 8, 2019, for Chinese Application No. 201580010014.4, along with an English translation.
Japanese Notification of Reasons for Refusal, dated Jan. 7, 2019, for Japanese Application No. 2016-511943, along with an English translation.

* cited by examiner

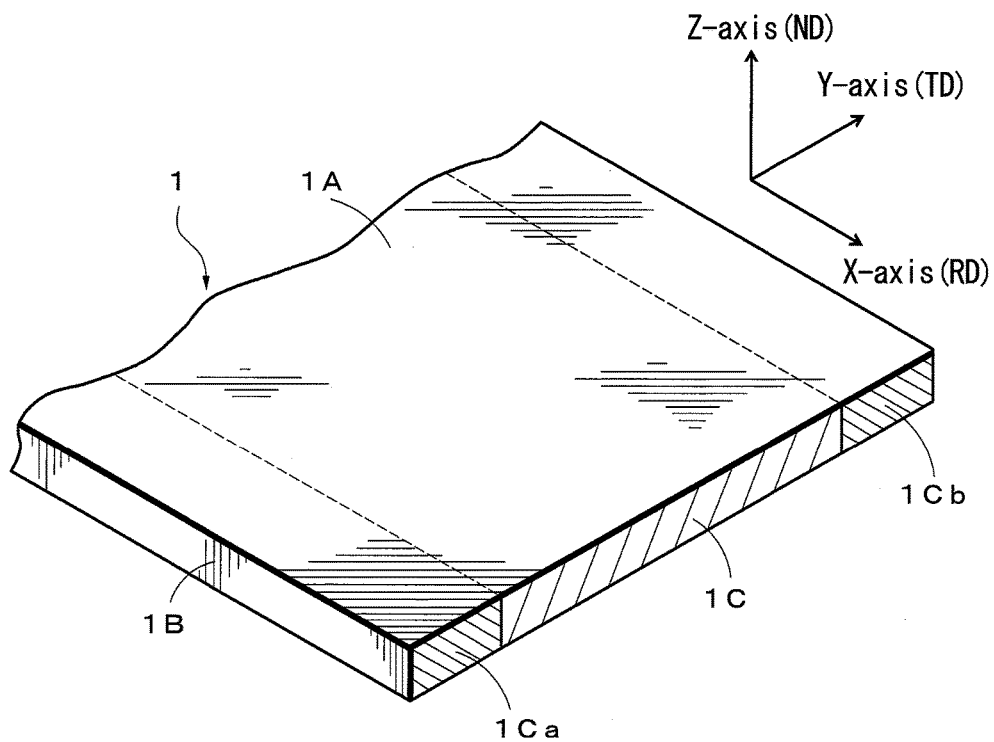
F I G. 1
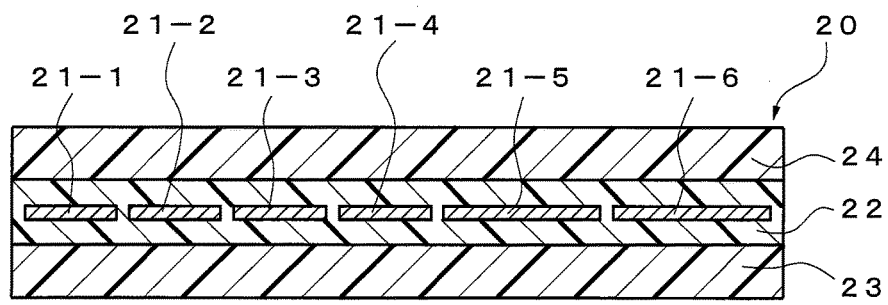
F I G. 3

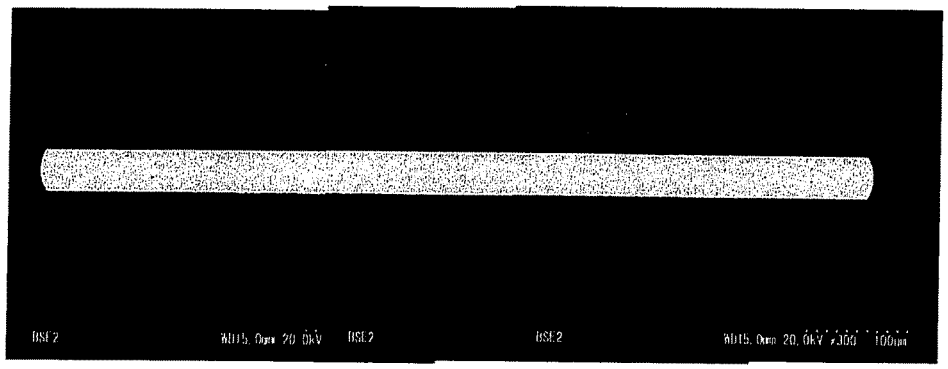
F I G. 2 A
F I G. 2 B
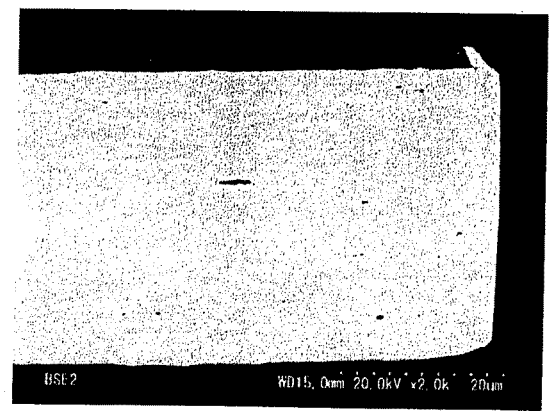
F I G. 2 C

ROLLED COPPER FOIL, METHOD OF MANUFACTURING A ROLLED COPPER FOIL, FLEXIBLE FLAT CABLE, AND METHOD OF MANUFACTURING A FLEXIBLE FLAT CABLE

CROSS REFERENCE TO RELATED APPLICATIONS

This is a continuation application of International Patent Application No. PCT/JP2015/060175 filed Mar. 31, 2015, which claims the benefit of Japanese Patent Application No. 2014-073379 filed Mar. 31, 2014, the full contents of both of which are hereby incorporated by reference in their entirety.

BACKGROUND

Technical Field

The present disclosure relates to a rolled copper foil obtained by rolling a round wire rod comprising one of copper and a copper alloy, and a method of manufacturing the same, as well as a flexible flat cable and a method of manufacturing the same, and particularly relates to a rolled copper foil used for flexible flat cables or the like subjected to repeated bending motions in automotive components and a method of manufacturing the same.

Background Art

Existing flexible flat cables (FFCs) are used for various applications owing to their high degree of freedom in the configuration of installation to electronic devices resulting from features such as a small thickness and an excellent flexibility. For example, they are widely used in applications such as a steering roll connector (SRC), which is a component of an air bag system in automobiles, a foldable section of foldable cell-phones, a movable part of digital cameras, printer heads, or the like, and wirings of a movable part of disc associated devices including HDDs (Hard Disk Drives), DVD (Digital Versatile Disc) drives, Blu-ray Disc drives, and CD (Compact Disc) drives. A rolled copper foil is generally used for a conductor portion of such flexible flat cables.

As an existing rolled copper foil, for example, a rolled copper foil has been disclosed which has a cube texture for which:

$$I/I(0) > 20,$$

where I is an integral strength of the (200) plane obtained by X-ray diffraction of a copper foil, and I(0) is an integral strength of the (200) plane obtained by X-ray diffraction of fine powder copper (Japanese Laid-Open Patent Publication No. 2006-326684). It is disclosed that, with this technique, life expectancy can be made longer by using a copper foil having a texture with an excellent flex resistance, and that downsizing and improvement in performance of a flexible printed circuit board (FPC) can be achieved.

As another existing rolled copper foil, a rolled copper foil is disclosed that is manufactured by rolling a round wire rod and for which a crystal average particle diameter with respect to the film thickness is specified (Japanese Patent No. 5342712). According to this technique, a flex resistance is improved by refining crystals in an outermost surface where a break due to fatigue starts.

However, with the technique described in Japanese Laid-Open Patent Publication No. 2006-326684, the copper foil is manufactured by rolling a plate material, and thus when manufacturing a FFC using the copper foil, it is required to perform a slitting process on the copper foil that gives rise to an increase in costs. Further, despite an increasing need for a FFC with a narrower width, it was difficult to sufficiently narrow the width of a copper foil with a method using a slitting process. Also, Japanese Laid-Open Patent Publication No. 2006-326684 does not disclose a technique for manufacturing a copper foil from a round wire.

On the other hand, with a technique of Japanese Patent No. 5342712, it is disclosed that a copper foil is manufactured by rolling a round wire and has a high flex resistance, but texture control is not performed, and recently, there is a need for further improvement in properties to meet the requirements for a high flex resistance required for the aforementioned SRC, for example.

The present disclosure is related to providing a rolled copper foil and a flexible flat cable that have an improved flex resistance and that are capable of achieving an ease of processing and a reduced cost, even when manufacturing a copper foil having a narrow width, as well as methods of manufacturing the same.

SUMMARY

The present inventor carried out assiduous studies on a copper alloy suitable for FFC, and as a result, reached the findings that, upon rolling a round wire rod having a circular cross section, crystal grains in a Cube orientation {001}<100> in a texture of a copper foil can be controlled, and further an industrially improved control method thereof, as well as the findings that in a case where the crystal grains are accumulated at an area ratio of greater than or equal to 6%, a rolled copper foil having an improved flex resistance and less occurrence of buckling when employed in FFC can be manufactured at a low cost.

Further, since the present disclosure is directed to manufacturing a copper foil by performing a rolling process on a round wire, it was found that, in a case where the width is narrowed to a few millimeter or narrower, an easy workability can be achieved by manufacturing a copper foil by rolling a round wire, whereas difficulty in working is significantly increased with the existing slitting processes.

According to a first aspect of the present disclosure, a rolled copper foil comprising or consisting of one of copper and a copper alloy, the rolled copper foil having a rolled surface and two side surfaces adjacent to the rolled surface, each of the side surfaces being a non-sheared surface that is not a sheared surface, an area ratio of crystal grains oriented at a deviation angle of less than or equal to 13° from a Cube orientation being greater than or equal to 6%.

According to a second aspect of the present disclosure, a flexible flat cable includes: a rolled copper foil including one of copper and a copper alloy, the rolled copper foil having a rolled surface and two side surfaces adjacent to the rolled surface, each of the side surfaces being a non-sheared surface that is not a sheared surface, an area ratio of crystal grains oriented at a deviation angle of less than or equal to 13° from Cube orientation being greater than or equal to 6%; and an insulating film disposed on both faces of the rolled copper foil.

According to a third aspect of the present disclosure, there is provided a method of manufacturing a rolled copper foil, the rolled copper foil comprising one of copper and a copper alloy and having a rolled surface and two side surfaces adjacent to the rolled surface, each of the side surfaces being a non-sheared surface that is not a sheared surface, an area ratio of crystal grains oriented at a deviation angle of less than or equal to 13° from Cube orientation being greater than or equal to 6%, the method comprising:

performing a first heat treatment on a round wire rod comprising one of copper and a copper alloy at 200 to 600° C. for 10 seconds to two hours;

performing a wire drawing process on the round wire rod, which has been subjected to the first heat treatment, with a reduction of area being greater than or equal to 75%;

performing a first rolling process on the round wire rod, which has been subjected to the wire drawing process, to form a planar wire rod;

performing a second heat treatment on the planar wire rod at 200 to 600° C. for 10 seconds to two hours; and performing a second rolling process on the planar wire rod, which has been subjected to the first heat treatment, with a reduction of area being less than or equal to 50% to forms a foil material.

According to a fourth aspect of the present disclosure, there is provided a method of manufacturing a flexible flat cable comprising forming an insulating film on both faces of a rolled copper foil by performing a lamination process at a temperature lower than a recrystallization temperature of the rolled copper foil, the rolled copper foil comprising one of copper and a copper alloy and having a rolled surface and two side surfaces adjacent to the rolled surface, each of the side surfaces being a non-sheared surface that is not a sheared surface, an area ratio of crystal grains oriented at a deviation angle of less than or equal to 13° from Cube orientation being greater than or equal to 6%, the rolled copper foil being obtained by a method of manufacturing a rolled copper foil, including:

performing a first heat treatment on a round wire rod comprising one of copper and a copper alloy at 200 to 600° C. for 10 seconds to two hours;

performing a wire drawing process on the round wire rod, which has been subjected to the first heat treatment, with a reduction of area being greater than or equal to 75%;

performing a first rolling process on the round wire rod, which has been subjected to the wire drawing process, to form a planar wire rod;

performing a second heat treatment on the planar wire rod at 200 to 600° C. for 10 seconds to two hours; and performing a second rolling process on the planar wire rod, which has been subjected to the first heat treatment, with a reduction of area being less than or equal to 50% to forms a foil material.

In the present disclosure, flex life cycle refers to a number of cycles before the rolled copper foil breaks in a bending test that is carried out under a test condition of bend radius R=6.5 mm, stroke S=±13 mm, ambient temperature 85° C., and rotational speed 900 rpm.

According to the present disclosure, even in a case of manufacturing a copper foil having a narrow width, a rolled copper foil having an improved flex resistance and, when used in a FFC, an improved bucking resistance is provided. Accordingly, a rolled copper foil of the present embodiment can be used for a SRC equipped with a FFC and also wirings of a foldable section of cell-phones, a movable part of digital cameras, printer heads, or the like, and movable part of disk associated equipment such as HDDs, and DVD drives, Blu-ray Disc drives and CD drives.

BRIEF DESCRIPTION OF DRAWINGS

FIG. 1 is a perspective view (partial cross sectional view) of a rolled copper foil according to an embodiment of the present disclosure.

FIG. 2A is an electron microscope image of a rolled copper foil according to an embodiment of the present disclosure shown in a cross sectional view in a TD direction; FIG. 2B is an enlarged sectional view of an end portion of the rolled copper foil shown in FIG. 2A; and FIG. 2C is an enlarged sectional view of an end portion of a rolled copper foil obtained by slitting a plate material of the related art.

FIG. 3 is a cross sectional view of a flexible flat cable manufactured using the rolled copper foil of the present embodiment.

DETAILED DESCRIPTION

Figure 4:
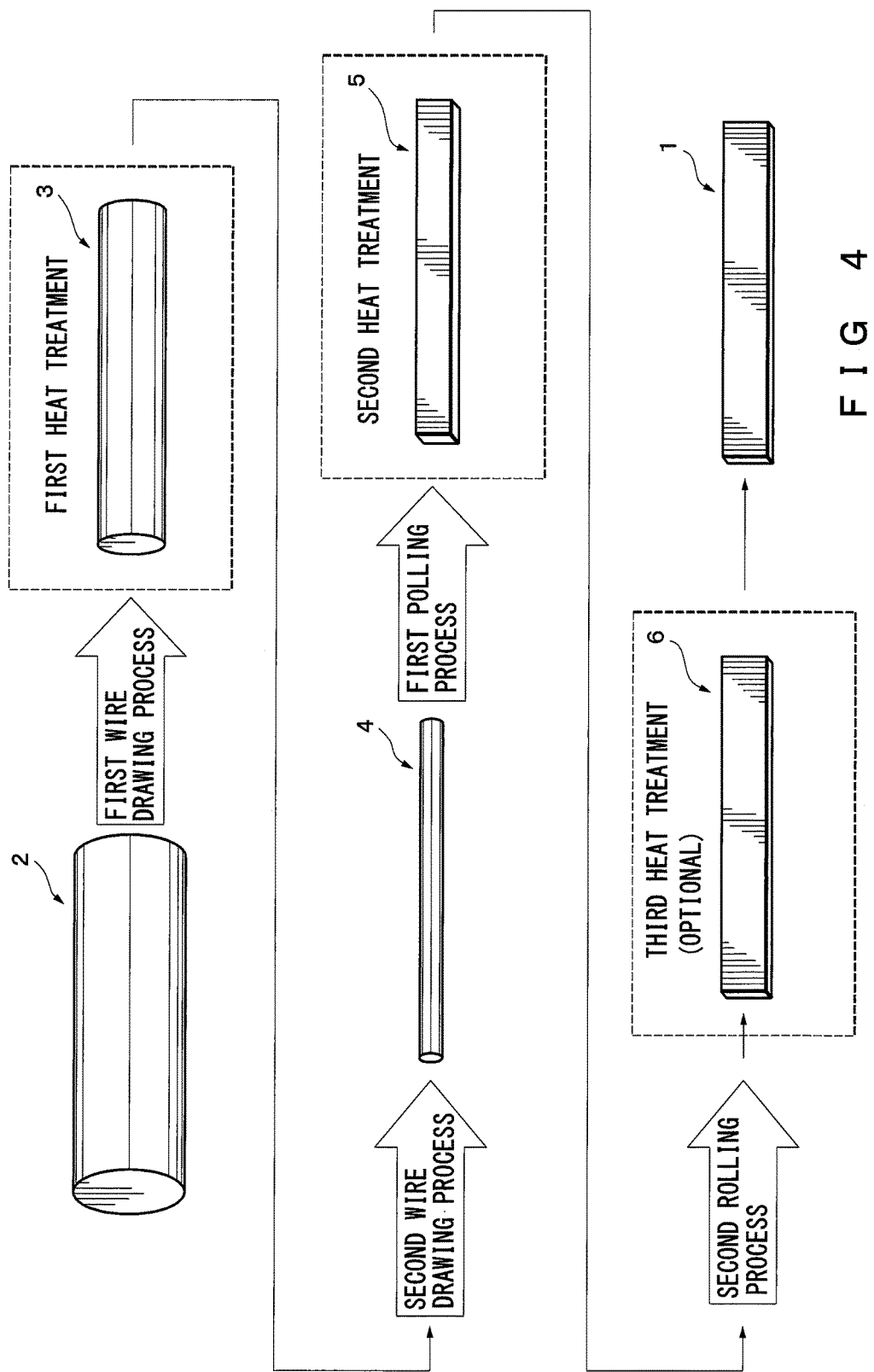
FIG. 4 is a diagram for explaining a method of manufacturing the rolled copper foil according to the present embodiment.
Figure 5:
FIG. 5 is a plan view for explaining a method of measuring an area ratio of Cube orientation in the rolled copper foil of the present embodiment.

Further features of the present disclosure will become apparent from the following detailed description of exemplary embodiments with reference to the accompanying drawings.

(Rolled Copper Foil)

A rolled copper foil of one embodiment of the present disclosure is a rolled copper foil obtained by rolling a round wire rod comprising or consisting of copper or a copper alloy.

As shown in FIG. 1, a rolled copper foil 1 has a rolled surface 1A and side surfaces 1B that are non-sheared surfaces adjacent to the rolled surface 1A. In FIG. 1, X-Y-Z axes define a rectangular coordinate system: X-axis represents RD which is a rolling direction; Z-axis represents ND which is a normal direction perpendicular to the rolled surface 1A; and Y-axis represents TD which is a transverse direction which is a direction perpendicular to RD and TD. Reference numeral 1C indicates a cross section perpendicular to the rolling direction RD, and which is also referred to as an RD surface. Further, the RD surface 1C includes rectangular area regions (two end regions in a transverse direction of a rolled surface) each corresponding to 10% width on either side thereof, which are indicated by reference numerals 1Ca and 1Cb and hereinafter merely referred to as two end portions 1Ca and 1Cb.

Herein, the non-sheared surface described above means that a sheared surface due to a slitting process using a slitter is not produced, and this is a characteristic feature of the rolled copper foil 1 manufactured from a round wire.

FIG. 2A shows an overall cross sectional photographic image of the rolled copper foil 1 of the present embodiment in the RD surface, and FIG. 2B shows an enlarged view thereof (similarly, in the RD surface) in the vicinity of the side surfaces 1B that are non-sheared surfaces. The side surfaces 1B at both sides in a transverse direction of the rolled copper foil 1 are non-sheared surfaces, and the non-sheared surfaces are curved surfaces having a predetermined curvature. Burr and shear droop (shear failure) are not produced at corner portions between the non-sheared surfaces and the rolled surface. On the other hand, as shown in FIG. 2C, a rolled copper foil obtained by slitting a foil material has side surfaces at both sides in the transverse direction thereof that are sheared surfaces, and the sheared surfaces are flat surfaces that are substantially perpendicular to the rolled surface. Burr and shear droops are produced at corner portions between the sheared surfaces and the rolled surface.

The width and thickness of the rolled copper foil 1 is not particularly limited, and can be appropriately determined depending on the use, but it is preferable that the width is 0.300 mm to 2.000 mm, and the thickness is 0.010 mm to 0.200 mm. Particularly, since the rolled copper foil 1 of the present embodiment is a rolled copper foil obtained by rolling a round wire rod, the width can be narrowed as compared to a conventional manner in which the rolled foil is manufactured by merely slitting.

Copper or a copper alloy used for the rolled copper foil 1 is tough pitch copper (TPC: Tough Pitch Copper), oxygen-free copper (OFC: Oxygen-Free Copper) or a dilute copper alloy containing a small amount of elements added thereto. Among these, the dilute copper alloy is specified by a degree of accumulation of a texture in a predetermined direction and a strength of a rolled plate. Therefore, as long as copper or a copper alloy as used herein has the aforementioned degree of accumulation and strength as a material, its final shape after the processing need not necessarily be a thin sheet.

Further, the rolled copper foil 1 of the present embodiment may be formed of pure copper such as tough pitch copper and oxygen-free copper, or a dilute copper alloy comprising or consisting of less than or equal to 1.0 mass % of at least one element selected from Mg, Zn, Sn, Ag, P, Cr, Si, Zr, Ti, and Fe, and the balance being copper and incidental impurities. The aforementioned elements are added for the purpose of increasing the strength and heat resistance without decreasing electric conductivity too much, and it is preferable that the total added amount thereof is less than or equal to 1.0 mass %. It is to be noted that a lower limit value of the added amount is not particularly specified, since it can be considered as pure copper when the added amount is 0%, however, in a case where the elements are positively added, the lower limit of the added amount is greater than or equal to 0.005 mass %. It is desirable that, with the conductivity of a standard soft copper conductivity being defined as 100%, such a dilute copper alloy has a conductivity of greater than or equal to 90%. Further, the added elements are not limited to those described above, as long as the aforementioned main purpose can be achieved.

Each element of the present disclosure will now be described in detail.

(Area Ratio of Crystal Grains Oriented at a Deviation Angle from the Cube Orientation of Less Than or Equal to 13° being Greater Than or Equal to 6%)

In the rolled copper foil 1 of the present embodiment, an area ratio of crystal grains oriented at a deviation angle of less than or equal to 13° from the Cube orientation {001}<100> is greater than or equal to 6%. The Cube orientation is an orientation of a crystal of copper or copper alloy matrix in the material, i.e., in the rolled copper foil. This orientation is a crystal orientation in which the {001} plane of a crystal (face centered cubic) of copper or copper alloy matrix is parallel to the rolled surface, and the <100> direction is parallel to the rolling direction (RD direction). It is to be noted that when the deviation angle from the ideal orientation is less than or equal to 13° (greater than or equal to 0° and less than or equal to 13°), it can also be considered as equivalent to the ideal orientation, and thus the orientation at a deviation angle of less than or equal to 13° from the Cube orientation can be considered as equivalent to the Cube orientation. Thus, the rolled copper foil of the present embodiment includes crystal grains that are strictly oriented at the Cube orientation as well as crystal grains that are oriented at an orientation rotated three-dimensionally within plus or minus 13° from the Cube orientation, and when observed in the RD surface, such crystal grains exist with an area occupancy (area ratio) of greater than or equal to 6%. Hereinafter, an orientation including the orientation where the deviation angle from the Cube orientation is less than or equal to 13° may simply be referred to as the Cube orientation.

By applying a wire drawing process and a rolling process, in the rolled material, crystal grains in the Cube orientation decreases and thus the flex resistance slightly decreases, and on the other hand, a yield strength due to work hardening increase and thus the mechanical strength increases. Also, by performing a recrystallization heat treatment, crystal grains in the Cube orientation develops and a flex resistance improves. Accordingly, in the present disclosure, a focus is made on an area ratio of crystal grains in the Cube orientation in the rolled copper foil, and, taking the area ratio into account, by performing a wire drawing process (high wire drawing process), a rolling process (high rolling process) and a recrystallization process under a predetermined condition such that a range of numerical value of the area ratio is greater than or equal to 6%, an improved flex resistance and mechanical strength are achieved simultaneously. On the other hand, in a case where an area ratio of the crystal grain oriented in the Cube orientation is less than 6%, the mechanical strength is sufficient but the flex resistance is insufficient. Therefore, in the rolled surface of the rolled copper foil of the present embodiment, the area ratio of crystal grains oriented in the Cube orientation is greater than or equal to 6%, and preferably greater than or equal to 10%.

The crystal orientation will now be described. The metal material is usually a polycrystalline material, and since the rolled copper foil is manufactured by repeating a rolling process for a plurality of times, crystals in the foil accumulates in a particular orientation. A state of a metal structure accumulated in a certain orientation is referred to as a texture. In order to discuss an aspect of the texture, a coordinate system for defining a direction of a crystal is required. Accordingly, in the present specification, in conformity with a general notation of a texture, a rectangular coordinate system is used in which X-axis represents a rolling direction (RD) in which a rolled copper foil is rolled and progresses, Y-axis represents a transverse direction (TD) of the rolled copper foil, and Z-axis represents a rolled surface normal direction (ND) which is perpendicular to a rolling surface of the rolled copper foil (see FIG. 1). An orientation of a certain single crystal grain existing in the rolled copper foil 1 is expressed as (hkl)[uvw] using a Miller index (hkl) of a crystal plane which is perpendicular to the Z-axis (parallel to the rolled surface) and an index [uvw] in a crystal orientation parallel to the X-axis. For example, it is shown as (132)[6-43] and (231)[3-46]. In other words, this indicates that a (132) plane of a crystal constituting the crystal grain is perpendicular to ND, and a [6-43] direction of a crystal constituting the crystal grain is parallel to RD. Note that (132)[6-43] and (231)[3-46] are equivalent due to a symmetric property of the face centered cubic lattice. A group of orientations having such an equivalent orientation is shown as {132}<643> using parenthesis notations ({ } and < >) to indicate the family.

Note that the crystal orientation (hkl)[uvw] itself uniquely determines an orientation of the crystal, and does not depend on a viewing direction. In other words, a crystal orientation can be specified by measuring from the rolling direction (RD) or from the rolled surface normal direction (ND).

However, in the present disclosure, since an area ratio of crystal grains oriented in the Cube orientation on the rolling surface is specified, a specific observation field of view is necessary for the rolled surface. Therefore, in the present disclosure, crystal grains are observed on the RD surface 1C, and an area ratio on this observation surface is measured. More specifically, in the entirety of the RD surface 1C, an orientation for which the deviation angle of less than or equal to 13° from the Cube orientation is measured and an area thereof is calculated by an imaging analysis, and an area of those having said orientation is divided by the total area of the RD surface 1C.

An EBSD method was used for an imaging analysis of the crystal orientation of the present disclosure. EBSD is an abbreviation for Electron Back Scatter Diffraction (electron back scatter diffraction), which is a crystal orientation analysis technique utilizing a backscattered electron Kikuchi line diffraction (Kikuchi pattern) that is produced when a sample is irradiated with an electron beam in a Scanning Electron Microscope (SEM). In the present disclosure, an entirety of the RD surface of the sample is scanned at a 0.5 μm step in each of ND and TD, and a crystal orientation is analyzed using a software for analysis "Orientation Imaging Microscopy v5" (product name) manufactured by EDAX TSL corporation. It is to be noted that in EBSD measurement, it is necessary to remove foreign matters attached to the surface to be measured and, at the same time, to mirror finish the surface to obtain a clear Kikuchi line diffraction image. In accordance with the present embodiment, polishing of the cross section is performed by a CP (cross section polisher) processing.

(At Both End Portions 1Ca and 1Cb, Area Ratio of Crystal Grains Oriented with Deviation Angle of Less Than or Equal to 13° from the Cube Orientation Being Greater Than or Equal to 15%)

According to the rolled copper foil 1 of the present embodiment, as shown in FIG. 1, at both end portions 1Ca and 1Cb of the RD surface 1C, an area ratio of crystal grains oriented in the Cube orientation (orientation at a deviation angle of less than or equal to 13° from the Cube orientation) was measured in a similar manner as described above, and when it is greater than or equal to 15%, respectively, and preferably greater than or equal to 20%, respectively, occurrence of fatigue fracture at end portions in a transverse direction of the rolled copper foil 1 can be suppressed and an improved flex resistance can be achieved.

(Flex Resistance)

The rolled copper foil 1 of the present embodiment preferably exhibits a flex life cycle of 500,000 cycles or more in a flex resistance test. With the flex life cycle of 500,000 cycles or more, product durability of FFC is particularly good. Accordingly, the rolled copper foil 1 of the present embodiment has a flex life cycle of 500,000 cycles or more, and preferably 700,000 cycles or more.

(Being Hard Copper)

The rolled copper foil of the present embodiment is, for example, hard copper. Herein, hard copper is a material in which stress is accumulated due to plastic working, i.e., a so-called work hardened material. In contrast to soft copper which is finished with an annealing step with recrystallization, hard copper is a material finished with cold-working. However, the rolled copper foil of the present embodiment is not limited to hard copper, and may be soft copper.

(Method of Manufacturing the Rolled Copper Foil According to the Present Disclosure)

The rolled copper foil of the present embodiment can be, for example, produced through various steps including: [1] first wire drawing process step, [2] first heat treatment step, [3] second wire drawing process step, [4] first rolling process step, [5] second heat treatment step, [6] second rolling process step, and [7] third heat treatment step, as shown in FIG. 4. Note that as long as the characteristics of the present disclosure are satisfied after the [6] second rolling process step, the [7] third heat treatment step can be omitted. Hereinafter, the steps [1] to [7] will be described.

[1] First Wire Drawing Process Step

A round wire rod 2 (or a bar) of cast copper or copper alloy that has been cast to have an outer diameter of greater than or equal to ϕ 8.0 mm is subjected to a first wire drawing process until the outer diameter becomes ϕ 0.400 mm to ϕ 4.000 mm.

[2] First Heat Treatment Step

The round wire rod 3 with ϕ 0.400 mm to ϕ 4.000 mm obtained by the wire drawing process described under section [1] is subjected to annealing. Heat treatment condition in this step is preferably 200 to 600° C. for 10 seconds to two hours. It is preferable that, as a criteria of softening, the tensile strength TS is about 250 MPa.

[3] Second Wire Drawing Process Step

After the heat treatment described under section [2], the round wire rod 3 with ϕ 0.400 mm to ϕ 4.000 mm is subjected to a second wire drawing process until ϕ 0.100 mm to ϕ 0.400 mm (high wire drawing process). The outer diameter of the round wire rod after the second wire drawing process has a significant influence on controlling of a plate width after a rolling process to be described below, and thus it is determined depending on the desired dimension of the end product, and a reduction of area in this wire drawing process needs to be greater than or equal to 75%. The reduction of area in the second wire drawing process step is preferably 85%, and more preferably 90%. The purpose of increasing the reduction of area in this step is to achieve a higher degree of accumulation of Cube orientation after the second heat treatment step (recrystallization process). The reduction of area X is expressed as:

$$X=(A1-A2)*100/A1,$$

where

A1 is a cross section perpendicular to a longitudinal direction of the round wire rod 3 before being worked, and A2 is a cross section perpendicular to a longitudinal direction of the round wire rod 4 after being worked.

It is to be noted that, since the cross section is determined by the outer diameter of the round wire rod, the same value can be obtained by calculation:

$$X=(R12-R22)*100/R12,$$

where

R1 is an outer diameter of the round wire rod 3 before processing, and

R2 is an outer diameter of the round wire rod 4 after processing.

[4] First Rolling Process Step

After the wire drawing process described under section [3], the round wire rod 4 is rolled to form a planar wire rod 5. In order to obtain a desired width and sheet thickness of an end product, there is a limitation on dimensions after this rolling process. For example, in a case where desired dimensions of the end product is width 0.800 mm and thickness 0.035 mm, this rolling process is performed such that it is rolled to have a sheet width of 0.770 mm and an appropriate sheet thickness for such a width is around 0.045 mm. Thereafter, a finish rolling process (the second rolling process) to be described later is applied to form an end product. The dimensions of the planar wire rod 5 formed by this first rolling process are not unique since they are determined based on various factors such as a type of wire rod, lubrication condition, a diameter ratio of roll and wire, rolling reduction in thickness, number of passes, and a tensile force, and the dimensions are arbitrary in a controllable range, but the reduction of area is preferably greater than or equal to 4%. Here, the reduction of area Y is expressed as:

$$Y=(A3-A4)*100/A3,$$

where
A3 is a cross sectional area perpendicular to a longitudinal direction of the round wire rod 4 before processing; and
A4 is a cross sectional area perpendicular to a longitudinal direction of the wire rod 5 after processing.

Also, since a reduction of area is specified in the finish rolling process (the second rolling process) to be described below, it is necessary to determine the reduction of area in this step in accordance with the reduction of area specified in the finish rolling process.

[5] Second Heat Treatment Step

Now, the planar wire rod 5 that is rolled as described under section [4] is subjected to annealing. Here, a minimum value of an average grain size is 3 μm, and a maximum value thereof is the same as the dimension of sheet thickness. Heat treatment condition in this step is preferably 200 to 600° C. for 10 seconds to two hours. It is preferable that, as a criteria of softening, a tensile strength TS is about 250 MPa.

[6] Second Rolling Process Step

After the heat treatment described under in section [5], the planar wire rod 5 is subjected to a finish rolling process to form a foil material 6 having the dimension (thickness) of the end product. A thickness reduction ratio Z in the second rolling process is 50% or less, and preferably 15 to 50% (high rolling process). The thickness reduction ratio Z is expressed as:

$$Z=(t1-t2)*100/t1,$$

where
t1 is a thickness of the planar wire rod 5 before processing, and
t2 is a thickness of the foil material 6 after processing. When the thickness reduction ratio is high, there are less Cube-oriented crystal grains. With the present embodiment, by carrying out both the high wire drawing process and the high rolling process, it is not necessary to thereafter perform a recrystallization heat treatment, and a mechanical strength of the foil material 6 can be maintained. It is to be noted that this rolling process of obtaining a foil material 6 from the planar wire rod 5 is the only process in which calculation is made based on the thickness reduction ratio, not the reduction of area.

[7] Third Heat Treatment Step

Then, the foil materials 6 is subjected to annealing to remove stress. This step may be omitted. For example, the heat treatment condition in this step is preferably 150 to 300° C. for 10 seconds to two hours. The third heat treatment is performed for the purpose of achieving an even higher flexibility by dislocation rearrangement due to a low temperature heat treatment, and does not have an influence on the size of the crystal grains. The rolled copper foil 1 is manufactured by performing a series of processes from the first wire drawing process to the third heat treatment in this manner. In a case where the third heat treatment step is omitted, the foil material 6 itself is the rolled copper foil 1.

As set forth above, according to the present disclosure, even in a case of manufacturing a copper foil having a narrow width, a rolled copper foil having an improved flex resistance and an improved buckling-resistant property when applied to FFC can be provided. Also, as compared to a manufacturing method including a slitting step, processing is easier and the manufacturing cost can be decreased. Further, since the copper foil itself has a mechanical strength, copper does not soften even if heated by the processes in the subsequent lamination process, and also since it is not necessary to perform a low temperature heat treatment as an after treatment, a degree of adhesion between the insulating film and the copper foil does not decrease. Therefore, FFC having a high reliability can be provided, and further SRC having a high reliability can be provided.

(Flexible Flat Cable)

As shown in FIG. 3, a flexible flat cable (FFC) of an exemplary embodiment of the present disclosure is provided with a plurality of rolled copper foils 21-1 to 21-6, an adhesive layer 22 to embed the plurality of rolled copper foils 21-1 to 21-6, and insulating films 23 and 24 disposed on both faces of the adhesive layer, respectively. The rolled copper foils 21-1 to 21-6 are arranged next to each other such that their in-plane directions of the rolled surfaces are substantially the same, and the insulating film 23 is provided at one rolled surface side of these rolled copper foils and the insulating film 24 is provided at another rolled surface side.

The adhesive layer 22 has a thickness sufficient to embed the plurality of rolled copper foils 21-1 to 21-6 and is sandwiched between the insulating films 23 and 24. The adhesive layer 22 is composed of a known adhesive adapted to the insulating films 23 and 24. The insulating films 23 and 24 are composed of a resin that can be lamination processed at a temperature lower than a recrystallization temperature of the rolled copper foil, and the resin that can be lamination processed refers to a resin that can exhibit good adhesion with an adhesive layer or the rolled copper foil at a temperature that is lower than the recrystallization temperature of copper or a copper alloy constituting the rolled copper foil. The insulating films 23 and 24 are composed of, for example, a polyethylene terephthalate (PET)-based resin, and preferably polyethylene terephthalate.

(Method of Manufacturing the Flexible Flat Cable)

In a method of manufacturing the FFC of the present embodiment, an insulating films are disposed placed, for example, on either side of the rolled copper foil, and a lamination process is performed at a temperature lower than the recrystallization temperature of the rolled copper foil, e.g., 100 to 200° C.

With such a temperature condition, the rolled copper foil is formed at an inner part of the FFC while maintaining the property as the previously described hard copper. Therefore, as compared to a case where it has become a soft copper, a mechanical strength can be kept high, and buckling is not likely to occur even if it is an FFC of a narrower width.

Since the rolled copper foil to be used in the manufacturing process described above is manufactured from a round wire into a desired width, it is not necessary to form into a copper foil by repeatedly performing the rolling process starting from an ingot, and also it is not necessary to perform a slitting process. Therefore, the manufacturing process can be performed at a lower cost.

The insulating films used in the manufacturing process has a width of 10 mm to 20 mm and a thickness of 0.01 mm to 0.1 mm, respectively. Thus, the FFC has a width of 10 mm to 20 mm, and a thickness of 0.03 to 0.4 mm. As described above, by using the rolled copper foil of the present embodiment, the FFC having a narrower width can be provided.

Further, since the insulating film can be selected from films that can be lamination processed at a temperature lower than a recrystallization temperature of the rolled copper foil, a low cost film can be used and the FFC can be obtained at a low cost.

(Comparison with Japanese Laid-Open Patent Publication No. 2006-326684 and Japanese Patent No. 5342712)

The technique in Japanese Laid-Open Patent Publication No. 2006-326684 achieves development of a cube structure by recrystallizing heat treatment, but the recrystallization heat treatment is usually performed when laminating the insulating films to a copper foil, and thus, after the lamination process, it becomes a copper foil corresponding to soft copper having a recrystallized structure. Therefore, the mechanical strength of the copper foil in the end product is low. For example, for SRC of a U-turn type, without an auxiliary roller, bucking occurs in FFC and does not function as an FFC. Also, regarding the development in copper foils having a narrower width, it is desired to improve the mechanical strength of the copper foil itself and it is desired to ensure a mechanical strength that is higher than that of soft copper or a conductor corresponding to soft copper.

On the other hand, as has been described above, with the rolled copper foil of the present embodiment, a desired mechanical strength can be improved by the Cube orientation having a predetermined area ratio, and even with FFC having a narrower width, buckling of the FFC can be prevented by an appropriate lamination processing.

Also, the rolled copper foil of patent document 1 is described as a rolled copper foil which is suitable for an FPC, and also by considering its final reduction rate, it is considered to be manufactured by being subjected to a strip rolling process and a slitting step in which the material after rolling is cut into an elongated shape. However, since the slitting step requires higher cost than a round wire rolling process, and also the processing becomes more difficult when manufacturing a narrower material with a width of less than 0.8 mm, a further increase in the cost cannot be avoided.

On the other hand, the rolled copper foil or the FFC of the present embodiment can be made at low cost, since they are made from round wire as described above.

The technique of Japanese Patent No. 5342712 does not include a heat treatment step until a copper foil which is an end product is obtained, and thus it is assumed that the mechanical strength of the rolled copper foil itself is relatively high. However, since texture control is not performed, it is assumed that the mechanical strength is still insufficient. Also, a major portion of the copper foil of Japanese Patent No. 5342712 has a process structure, and by the heating in the lamination process, a recrystallized structure that it is not orientation controlled appears in the outermost layer which causes softening of the rolled copper foil, and the problem of buckling of FFC is likely to occur. On the other hand, if a low temperature heat treatment is performed to solve this problem, a degree of adhesion of the insulating films and the copper foil will decrease, which leads to a concern that the flex resistance is likely decrease in the end. Also, the copper foil of Japanese Patent No. 5342712 is directed to recrystallized soft copper only, and the plastic working before the recrystallization which corresponds to the wire drawing step before the recrystallization defined in the scope of the present disclosure is optional, and thus it can be determined that the crystal orientation control has not been considered.

On the other hand, with the FFC of the present embodiment, since the mechanical strength of the rolled copper foil is ensured by the Cube orientation having a predetermined area ratio, the flex resistance can be improved and buckling of FFC can be prevented by performing an appropriate lamination processing.

In the foregoing, the rolled copper foil, the FFC and the manufacturing methods thereof according to the above embodiments have been described, but the present disclosure is not limited to the embodiment described above, and various modifications and alterations are possible based on the technical idea of the present disclosure.

EXAMPLES

The present disclosure is described based on the following examples in detail. It is to be noted that the present disclosure is not limited to examples indicated below.

Examples 1 to 6

A round wire rod (TPC) of ϕ 9.000 mm was subjected to a wire drawing process to form a round wire rod of ϕ 0.600 mm to ϕ 4.000 mm, and thereafter subjected to a heat treatment at 200 to 600° C. for 10 seconds to two hours. Here, a criteria of softening was Tensile Strength (TS)=250 MPa. Further, the round wire rod after the heat treatment was subjected to a wire drawing process with a reduction of area of greater than or equal to 75% to form a round wire rod of ϕ 0.230 mm. Then, the round wire rod of ϕ 0.230 mm was subjected to a rolling process to form a planar wire rod having a thickness of 0.035 mm to 0.050 mm. Thereafter, the planar wire rod was subjected to a heat treatment again at 200 to 600° C. for 10 seconds to two hours. Then, the planar wire rod after the heat treatment was further subjected to a rolling process to fabricate a foil material having a thickness of 0.035 mm. Finally, a stress relief annealing process was applied as needed at 150 to 300° C. for 10 seconds to two hours to obtain an end product. The copper foil of the end product had a width of 0.800 mm and a thickness of 0.035 mmt. A series of flow including first wire drawing process→first heat treatment→second wire drawing process→first rolling process→second heat treatment→second rolling process→(third heat treatment) is referred to as a manufacturing process (I).

Example 7

In place of the manufacturing process (I), a manufacturing process (I') including a series of flow including: first wire drawing process (ϕ 9.000 mm→ϕ 0.600 mm)→first heat treatment (softening criteria: TS=250 MPa)→second wire drawing process (ϕ 0.600 mm→ϕ 0.230 mm)→first rolling process (ϕ 0.230 mm→0.035 mmt)→second heat treatment (recrystallization process) was performed to obtain an end product.

Comparative Example 1

In place of the manufacturing process (I), a manufacturing process (II) including a series of flow including: first wire drawing process (ϕ 9.000 mm→ϕ 0.230 mm)→first rolling process (ϕ 0.230 mm→0.050 mmt)→second heat treatment (softening criteria: TS=250 MPa)→second rolling process (0.050 mmt→0.035 mmt) was performed to obtain an end product.

Comparative Example 2

In place of the manufacturing process (I), a manufacturing process (III) including a series of flow including: first wire drawing process (φ 9.000 mm→φ 0.400 mm)→first heat treatment (softening criteria: TS=250 MPa)→second wire drawing process (φ 0.400 mm→0.230 mm)→first rolling process (φ 0.230 mm→0.0467 mmt)→second heat treatment (softening criteria: TS=250 MPa)→second rolling process (0.0467 mmt→0.035 mmt) was performed to obtain an end product.

Comparative Example 3

In place of the manufacturing process (I), a manufacturing process (IV) including a series of flow including: first wire drawing process (φ 9.000 mm→φ 4.000 mm)→first heat treatment (softening criteria: TS=250 MPa)→second wire drawing process (φ 4.000 mm→φ 0.230 mm)→first rolling process (φ 0.230 mm→0.035 mmt)→third heat treatment (stress relief heat treatment) was performed to obtain an end product. With this manufacturing process, the second rolling process step and the second heat treatment step were not performed since the final foil thickness is obtained by the first rolling process.

Comparative Example 4

In place of the manufacturing process (I), a manufacturing process (V) including a series of flow including: first wire drawing process (φ 9.000 mm→φ 0.600 mm)→first heat treatment (softening criteria: TS=250 MPa)→second wire drawing process (φ 0.600 mm→φ 0.230 mm)→first rolling process (φ 0.230 mm→0.075 mmt)→second heat treatment (softening criteria: TS=250 MPa)→second rolling process (0.075 mmt→0.035 mmt)→third heat treatment (stress relief heat treatment) was performed to obtain an end product.

Examples 8 to 13

A round wire rod (TPC) of φ 9.000 mm was subjected to a wire drawing process to form a round wire rod of φ 0.900 to 2.600 mm, and thereafter subjected to a heat treatment at 200 to 600° C. for 10 seconds to two hours. Here, a criteria of softening was Tensile Strength (TS)=250 MPa. Further, the round wire rod after the heat treatment was subjected to a wire drawing process with a reduction of area of greater than or equal to 75% to form a round wire rod of φ 0.170 mm. Then, this round wire rod was subjected to a rolling process to form a planar wire rod having a thickness of 0.045 mm. Thereafter, the planar wire rod was subjected to a heat treatment again at 200 to 600° C. for 10 seconds to two hours. Then, the planar wire rod after the heat treatment was further subjected to a rolling process to manufacture a foil material having a thickness of 0.035 mm. Finally, a stress relief annealing process was applied as needed to obtain an end product. The copper foil of the end product had a width of 0.500 to 1.400 mm and a thickness of 0.035 mm. A series of flow including first wire drawing process→first heat treatment→second wire drawing process→first rolling process→second heat treatment→second rolling process→ (third heat treatment) is referred to as a manufacturing process (I).

Comparative Examples 5 to 8

Rolled copper foils were obtained by methods similar to Comparative Examples 1 to 4, respectively, except that a wire diameter before the first rolling process was φ 0.170 mm to obtain foil materials having a width of 0.500 to 1.400 mm and a thickness of 0.035 mm as end products.

Comparative Examples 9 to 12

Rolled copper foils were obtained by methods similar to Comparative Examples 1 to 4, respectively, except that a wire diameter before the first rolling process was φ 0.260 mm to obtain foil materials having a width of 0.500 to 1.400 mm and a thickness of 0.035 mm as end products.

Comparative Example 13 to 16

Rolled copper foils were obtained by methods similar to Comparative Examples 1 to 4, respectively, except that a wire diameter before the first rolling process was φ 0.300 mm to obtain to obtain foil materials having a width of 0.500 to 1.400 mm and a thickness of 0.035 mm as end products.

Reference Example

As an example using a slitting process, a copper plate of TPC having a thickness of 0.400 mm was subjected to a rolling process to form a sheet material having a thickness of 0.100 mm, and subsequently subjected to a recrystallization process with a criteria for softening being tensile strength (TS)=250 MPa, and further subjected to a rolling process to form a copper foil having a thickness of 0.035 mm, and finally the copper foil was cut into an elongated shape to obtain a copper foil having a width of 0.500 mm and 0.800 mm and a thickness of 0.035 mm. A series of flow including first rolling process→heat treatment→second rolling process→slitting process is referred to as a manufacturing process (VIII).

Then, Examples 1 to 13, Comparative Examples 1 to 16 and Reference Example fabricated as described above were evaluated by the following method.

(Reduction of Area in a Wire Drawing Process and a Rolling Process)

The reduction of area in the second wire drawing process was calculated based on the cross section (substantially circular) of the round wire rod immediately before the second wire drawing process and the cross section (substantially circular) of the round wire rod immediately after the second wire drawing process. Also, the reduction of area in the first rolling process was calculated based on the cross section of the round wire rod immediately before the first rolling process and the cross section (substantially rectangular) of the planar wire rod immediately after the first rolling process, and further, a rolling reduction in thickness of the second rolling process was calculated based on the cross section of the planar wire rod immediately before the second rolling process and the cross section (substantially rectangular) of the foil material immediately after the second rolling process.

(Area Ratio of Crystal Grains Oriented at a Deviation Angle of Less than or Equal to 13° from the Cube Orientation)

Using the EBSD method described above, an area ratio (area ratio A) of crystal grains oriented at a deviation angle of less than or equal to 13° from the Cube orientation in the RD surface 1C was measured. Also, for each rolled copper foil, an area ratio (area ratio B) of crystal grains oriented at a deviation angle of less than or equal to 13° from the Cube orientation at both end portions 1Ca and 1Cb was measured. Measurement was carried out under a condition with an approximately 500 μm square measurement region and a scan step of the determination under conditions of 0.5 μm. The measurement area was adjusted using a standard which is to include 200 or more crystal grains. As to the deviation angle, an angle of rotation about a common axis of rotation was calculated and determined as a deviation angle. Also, a rotation angle with respect to the Cube orientation was calculated for various axes of rotation. An axis of rotation which can be expressed with the smallest deviation angle was employed. The deviation angle was calculated for all measured points while taking digits to first decimal place as significant figures, and an area ratio was calculated by dividing an area of crystal grains having an orientation of less than or equal to 13° from the Cube orientation by the total measurement area.

(Flex Resistance Test)

Figure 6:
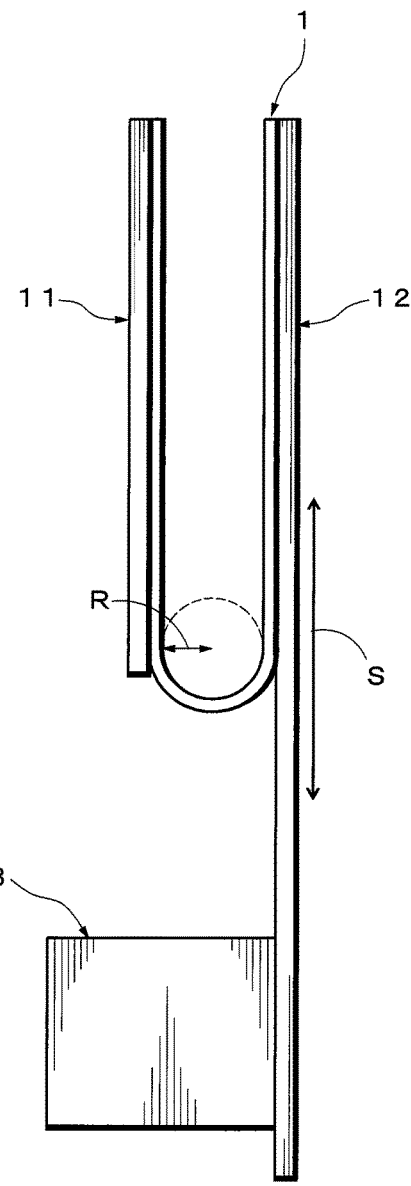
FIG. 6 is a side view schematically showing a state where the rolled copper foil is secured to a bending tester used in a flex resistance test in an embodiment of the present disclosure.

Using a FPC bending tester (manufactured by Ueshima Seisakusho Co., Ltd. Device Name "FT-2130") as shown in FIG. 6, a bending test was carried out by securing the rolled copper foil 1 to a sample fixing plate 11 and a movable plate 12, and moving the movable plate 12 with a motor section 13. The flex resistance test was conducted on the rolled copper foil as a single body. Test condition was bend radius R=6.5 mm, stroke S=±13 mm, ambient temperature 85° C., rotational speed 900 rpm, flex life cycle is a number of cycles when the rolled copper foil 1 comes to a break condition, and the bending test was repeated until the rolled copper foil 1 came to a break condition, and the flex life cycle at that timing was measured. Evaluation criteria was: a pass "○" for 500,000 cycles or more which is determined as a life expectancy that is sufficient as a product specification; a fail "Δ" for greater than or equal 400,000 cycles and less than or equal to 500,000 cycles which is determined as a life expectancy that may not satisfy a product specification; a fail "x" for less than 400,000 cycles which is determined as a life expectancy that does not satisfy a product specification.

The result of measurements and evaluations as described above are indicated in Tables 1 and 2.

TABLE 1

(φ9 mm round wire → width 0.8 mm copper foil)

| | MANUFACTURING PROCESS | ANNEALING AFTER FIRST WIRE DRAWING | AREA REDUCTION IN SECOND WIRE DRAWING PROCESS % | ANNEALING AFTER ROLLING OF ROUND WIRE | AREA REDUCTION IN SECOND ROLLING PROCESS % | AREA RATIO A % | AREA RATIO B % | FLEX RESISTANCE DETERMINATION |
|---|---|---|---|---|---|---|---|---|
| EXAMPLE 1 | (I) | ○ | 93.5 | ○ | 22 | 8 | 16 | ○ |
| EXAMPLE 2 | (I) | ○ | 93.5 | ○ | 30 | 6 | 16 | ○ |
| EXAMPLE 3 | (I) | ○ | 85.3 | ○ | 25 | 12 | 17 | ○ |
| EXAMPLE 4 | (I) | ○ | 85.3 | ○ | 20 | 14 | 18 | ○ |
| EXAMPLE 5 | (I) | ○ | 99.6 | ○ | 25 | 15 | 20 | ○ |
| EXAMPLE 6 | (I) | ○ | 99.7 | ○ | 10 | 18 | 25 | ○ |
| EXAMPLE 7 | (I') | ○ | 85.3 | ○ | 0 | 23 | 25 | ○ |
| COMPARATIVE EXAMPLE 1 | (II) | x | — | ○ | 30 | *5* | *12* | x |
| COMPARATIVE EXAMPLE 2 | (III) | ○ | *66.9* | ○ | 25 | *4* | *4* | x |
| COMPARATIVE EXAMPLE 3 | (IV) | ○ | 99.7 | x | 26.3 | *1* | *1* | x |
| COMPARATIVE EXAMPLE 4 | (V) | ○ | 85.3 | ○ | *53* | *5* | *8* | x |

N.B. NUMERICAL VALUES IN BOLD ITALIC IN THE TABLE ARE OUT OF APPROPRIATE RANGE OF THE EXAMPLE

TABLE 2

(φ9 mm round wire → width 0.5, 1.1, 1.4 mm copper foil)

| | MANUFACTURING PROCESS | ANNEALING AFTER FIRST WIRE DRAWING | AREA REDUCTION IN SECOND WIRE DRAWING PROCESS % | ANNEALING AFTER ROLLING OF ROUND WIRE | AREA REDUCTION IN SECOND ROLLING PROCESS % | FINAL SHEET WIDTH mm | AREA RATIO A % | AREA RATIO B % | FLEX RESISTANCE DETERMINATION |
|---|---|---|---|---|---|---|---|---|---|
| EXAMPLE 8 | (I) | ○ | 96.4 | ○ | 22 | 0.5 | 15 | 19 | ○ |
| EXAMPLE 9 | (I) | ○ | 98.9 | ○ | 25 | 0.5 | 21 | 25 | ○ |
| EXAMPLE 10 | (I) | ○ | 91.7 | ○ | 22 | 1.1 | 14 | 18 | ○ |
| EXAMPLE 11 | (I) | ○ | 97.4 | ○ | 20 | 1.1 | 16 | 20 | ○ |
| EXAMPLE 12 | (I) | ○ | 88.9 | ○ | 22 | 1.4 | 10 | 14 | ○ |
| EXAMPLE 13 | (I) | ○ | 98.7 | ○ | 15 | 1.4 | 17 | 22 | ○ |
| COMPARATIVE EXAMPLE 5 | (II) | x | — | ○ | 30 | 0.5 | *5* | *13* | x |
| COMPARATIVE EXAMPLE 6 | (III) | ○ | *67.9* | ○ | 25 | 0.5 | *4* | *6* | x |

TABLE 2-continued (φ9 mm round wire → width 0.5, 1.1, 1.4 mm copper foil)

| | MANU-FACTURING PROCESS | ANNEALING AFTER FIRST WIRE DRAWING | AREA REDUCTION IN SECOND WIRE DRAWING PROCESS % | ANNEAL-ING AFTER ROLLING OF ROUND WIRE | AREA REDUCTION IN SECOND ROLLING PROCESS % | FINAL SHEET WIDTH mm | AREA RATIO A % | AREA RATIO B % | FLEX RESISTANCE DETERMINATION |
|---|---|---|---|---|---|---|---|---|---|
| COMPARATIVE EXAMPLE 7 | (IV) | ○ | 98.9 | x | 22.9 | 0.5 | *2* | *2* | x |
| COMPARATIVE EXAMPLE 8 | (V) | ○ | 92 | ○ | *53* | 0.5 | *4* | *7* | x |
| COMPARATIVE EXAMPLE 9 | (II) | x | — | ○ | 30 | 1.1 | *5* | *10* | x |
| COMPARATIVE EXAMPLE 10 | (III) | ○ | *73* | ○ | 25 | 1.1 | *4* | *6* | x |
| COMPARATIVE EXAMPLE 11 | (IV) | ○ | 99 | x | 27.5 | 1.1 | *1* | *1* | x |
| COMPARATIVE EXAMPLE 12 | (V) | ○ | 81.2 | ○ | *53* | 1.1 | *4* | *7* | x |
| COMPARATIVE EXAMPLE 13 | (II) | x | — | ○ | 30 | 1.4 | *5* | *11* | x |
| COMPARATIVE EXAMPLE 14 | (III) | ○ | *64* | ○ | 25 | 1.4 | *4* | *5* | x |
| COMPARATIVE EXAMPLE 15 | (IV) | ○ | 99.4 | x | 30.7 | 1.4 | *1* | *1* | x |
| COMPARATIVE EXAMPLE 16 | (V) | ○ | 75 | ○ | *53* | 1.4 | *4* | *6* | x |
| REFERENCE EXAMPLE | (VIII) | — | — | — | — | 0.8 | 15 | 15 | Δ |

N.B. NUMERICAL VALUES IN BOLD ITALIC IN THE TABLE ARE OUT OF APPROPRIATE RANGE OF THE EXAMPLE

Referring to results in Table 1, it can be seen that, for each of Examples 1 to 7, an area ratio (area ratio A) of crystal grains oriented at a deviation angle of less than or equal to 13° from the Cube orientation in the rolled surface of the rolled copper foil was greater than or equal to 6% and the flex life cycle was greater than or equal to 500,000 times, and the flex resistance property was good. Also, it can be seen that, for each of Examples 3 to 7, an area ratio (area ratio B) of crystal grains oriented at a deviation angle of less than or equal to 13° from the Cube orientation at both end portions 1Ca and 1Cb was greater than or equal to 15% and the flex life cycle was greater than or equal to 500,000 times, and the flex resistance property was good.

On the other hand, with Comparative Examples 1 to 4, an area ratio (area ratio A) of crystal grains oriented at a deviation angle of less than or equal to 13° from the Cube orientation in the rolled surface of the rolled copper foil was out of range of the present disclosure, and also an area ratio (area ratio B) of crystal grains oriented at a deviation angle of less than or equal to 13° from the Cube orientation at both end portions 1Ca and 1Cb was out of range of the present disclosure, and the flex resistance property was insufficient.

Also, from the results indicated in Table 2, for each of Examples 8 to 13, an area ratio (area ratio A) of crystal grains oriented at a deviation angle of less than or equal to 13° from the Cube orientation in the rolled surface of the rolled copper foil was greater than or equal to 6% and the flex life cycle was greater than or equal to 500,000 times, and the flex resistance property was good. Also, it can be seen that, for each of Examples 8 to 11 and 13, an area ratio (area ratio B) of crystal grains oriented at a deviation angle of less than or equal to 13° from the Cube orientation at both end portions 1Ca and 1Cb was greater than or equal to 15% and the flex resistance property was good.

On the other hand, with Comparative Examples 5 to 16, an area ratio (area ratio A) of crystal grains oriented at a deviation angle of less than or equal to 13° from the Cube orientation in the rolled surface of the rolled copper foil was out of range of the present disclosure, and an area ratio (area ratio B) of crystal grains oriented at a deviation angle of less than or equal to 13° from the Cube orientation at both end portions 1Ca and 1Cb was out of range of the present disclosure, and the flex resistance property was insufficient. Further, with Reference Example, although it had a desired crystal orientation area ratio, the life expectancy greatly varied and did not always reach 500,000 cycles. This is because a dimensional accuracy of the slit narrow width material has a low dimensional accuracy and flexibility was adversely affected.

Therefore, it can be seen that when manufacturing a narrow width copper foil having a width of 0.500 mm to 1.400 mm by rolling a round wire rod, by providing an area ratio of crystal grains oriented at a deviation angle of less than or equal to 13° from the Cube orientation in the rolled surface of the rolled copper foil to be greater than or equal to 6%, the flex life cycle was greater than or equal to 500,000 times, and it is possible to achieve an improved flex resistance property and a longer life expectancy. It is to be noted that the above findings not only holds for tough pitch copper (TPC), but similarly holds for oxygen-free copper (OFC) or a copper alloy containing a total of less than or equal to 1.0 mass % of at least one element selected from Mg, Zn, Sn, Ag, P, Cr, Si, Zr, Ti, and Fe.

The rolled copper foil 1 of the present embodiment has an improved flexibly and an improved flex resistance, and thus can be preferably used as a flexible flat cable (FFC). Particularly, it can be preferably used for a steering roll connector (SRC), which is a component of an air bag system of an automobile, and automotive components such as a roof harness, a door harness, and floor harness.

What is claimed is:

1. A rolled copper foil comprising one of copper and a copper alloy, the rolled copper foil having a rolled surface and two side surfaces adjacent to the rolled surface, each of the side surfaces being a non-sheared surface, wherein
the rolled copper foil has a width of 0.300 mm to 2.000 mm and a thickness of 0.010 mm to 0.200 mm,
an area ratio A of crystal grains oriented at a deviation angle of less than or equal to 13° from Cube orientation being greater than or equal to 6%,
at two end regions each corresponding to 10%-width in a transverse direction, an area ratio B of crystal grains oriented at a deviation angle of less than or equal to 13° from Cube orientation is greater than or equal to 15%,
wherein the rolled copper foil has a flex life cycle of 500,000 cycles or more,
the rolled copper foil is hard copper in which stress is accumulated due to plastic working, and
the rolled copper foil is formed by subjecting a planar wire rod to a finish rolling process so that a thickness reduction ratio Z is 50% or less.

2. The rolled copper foil according to claim 1, wherein the rolled copper foil comprises a copper alloy comprising a total of greater than or equal to 0.005 mass % and less than or equal to 1.0 mass % of at least one element selected from Mg, Zn, Sn, Ag, P, Cr, Si, Zr, Ti, and Fe, the balance being copper and incidental impurities.

* * * * *